(12) United States Patent
Cheng et al.

(10) Patent No.: US 9,570,297 B1
(45) Date of Patent: *Feb. 14, 2017

(54) ELIMINATION OF DEFECTS IN LONG ASPECT RATIO TRAPPING TRENCH STRUCTURES

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/963,283

(22) Filed: Dec. 9, 2015

(51) Int. Cl.
*H01L 21/02* (2006.01)
*H01L 21/20* (2006.01)

(52) U.S. Cl.
CPC ......... *H01L 21/02636* (2013.01); *H01L 21/20* (2013.01); *H01L 21/2015* (2013.01)

(58) Field of Classification Search
CPC ............... H01L 21/308; H01L 21/0243; H01L 21/02381; H01L 21/02532; H01L 21/0259; H01L 21/02636
See application file for complete search history.

(56) References Cited

U.S. PATENT DOCUMENTS

| 7,459,380 | B2 | 12/2008 | Bour et al. | |
| 8,173,551 | B2* | 5/2012 | Bai | C30B 25/183 257/E21.09 |
| 8,324,660 | B2* | 12/2012 | Lochtefeld | H01L 21/02381 257/190 |
| 8,415,718 | B2 | 4/2013 | Xu | |
| 8,502,263 | B2* | 8/2013 | Li | H01L 21/02381 257/103 |
| 8,598,019 | B2 | 12/2013 | Arena | |
| 8,785,907 | B2 | 7/2014 | Goel et al. | |

(Continued)

OTHER PUBLICATIONS

IBM: List of IBM Patents or Patent Applicaiton Treated as Related (Appendix P), Feb. 12, 2016, pp. 1-2.

(Continued)

*Primary Examiner* — William Coleman
(74) *Attorney, Agent, or Firm* — Andrew G. Wakim

(57) ABSTRACT

A method of forming a semiconductor in a long trench. The method may include; forming a first semiconductor on a substrate and in a long trench; forming a first spacer along sidewalls of the long trench and above the first semiconductor, a portion of the first semiconductor remains exposed; recessing the exposed portion of the first semiconductor; forming an insulator layer on the recessed portion of the first semiconductor; forming a second semiconductor on the insulator layer; forming a second spacer on sidewalls of the first spacer and above the second semiconductor, a portion of the second semiconductor remains exposed; removing the exposed portion of the second semiconductor; and removing a frond end and a back end of the first semiconductor and the second semiconductor, wherein the front end and back end are separated by a central region and the central region extends across the width of the long trench.

19 Claims, 14 Drawing Sheets

(56) References Cited

U.S. PATENT DOCUMENTS

| | | |
|---|---|---|
| 8,847,279 B2 | 9/2014 | Bai et al. |
| 8,987,028 B2 | 3/2015 | Lochtefeld et al. |
| 9,064,698 B1 | 6/2015 | Khakifirooz et al. |
| 9,293,374 B1* | 3/2016 | Leobandung ... H01L 21/823412 |
| 2007/0054467 A1* | 3/2007 | Currie ............... H01L 21/76254 |
| | | 438/458 |
| 2009/0039361 A1* | 2/2009 | Li ..................... H01L 21/02381 |
| | | 257/94 |
| 2009/0321882 A1* | 12/2009 | Park ................... H01L 21/0237 |
| | | 257/615 |
| 2014/0213037 A1* | 7/2014 | LiCausi ............ H01L 21/76224 |
| | | 438/429 |
| 2014/0217467 A1* | 8/2014 | Pawlak .................. H01L 29/12 |
| | | 257/183 |
| 2014/0264612 A1* | 9/2014 | Cheng ............... H01L 21/02636 |
| | | 257/368 |
| 2015/0311292 A1* | 10/2015 | Srinivasan .......... H01L 29/0684 |
| | | 257/190 |
| 2015/0325619 A1* | 11/2015 | Cheng ............... H01L 27/14612 |
| | | 250/214 A |
| 2015/0380447 A1* | 12/2015 | Chou .................. H01L 27/1463 |
| | | 257/437 |
| 2016/0181099 A1* | 6/2016 | Mukherjee ........ H01L 21/02381 |
| | | 257/190 |

OTHER PUBLICATIONS

Pending U.S. Appl. No. 15/042,211, filed Feb. 12, 2016, titled "Elimination of Defects in Long Aspect Ratio Trapping Trench Structures," pp. 1-30.

* cited by examiner

ELIMINATION OF DEFECTS IN LONG ASPECT RATIO TRAPPING TRENCH STRUCTURES

BACKGROUND

The present invention generally relates to semiconductor device manufacturing, and more particularly to the elimination of defects in long Aspect Ratio Trapping (ART) trench structures.

The preparation of epitaxial layers on various substrates is an important field in modern materials science and technology. Such films are applied for example in protective coatings, thin film devices, semiconducting devices, laser diodes, sensors, for data storage devices, and for mounting organic, including biological layers onto suitable substrates. The term "epitaxial" means the ordered growth of a material on the surface of a substrate or another layer, such that the crystalline properties and orientation of the deposited material reflects the orientation and crystalline structure of the substrate. Thus epitaxial deposition processes provide means to form thin specifically oriented crystalline layers.

A problem in epitaxial deposition is one of lattice mismatch or misfit. Lattice mismatch occurs when the epitaxy layer and the seed layer have different lattice constants. Deviations of less than 1 percent readily result in structural defects, including various types of dislocation, and the built-up strain in the epitaxy layer.

SUMMARY

According to one embodiment of the present invention, a method is provided. The method may include: providing a dielectric layer on a substrate; forming a long trench in the dielectric layer exposing the substrate, wherein a length of the long trench is longer than a width of the long trench; forming a first semiconductor in the long trench; forming a first spacer on sidewalls of the long trench above the first semiconductor, wherein a portion of the top surface of the first semiconductor includes an exposed portion; recessing the exposed portion of the top surface of the first semiconductor; forming an insulator layer on the recessed top surface of the first semiconductor, wherein a sidewall portion of the first semiconductor is exposed above the insulator layer, and the sidewall portion of the first semiconductor is directly below the first spacer; forming a second semiconductor in the long trench along exposed sidewall portions of the first semiconductor, the second semiconductor is directly above the insulator layer, and the top surface of the second semiconductor is below the top surface of the first spacer; forming a second spacer in the long trench on sidewalls of the first spacer, the second spacer is directly above a sidewall portion of the second semiconductor, wherein the top surface of the second semiconductor includes a second exposed portion; removing the exposed portion of the second semiconductor, wherein the sidewall portion of the second semiconductor is exposed between the insulator layer and the second spacer; and removing a front end and a back end of the first semiconductor and the second semiconductor from above the insulator layer, wherein the front end and back end are separated by a central region which extends across the width of the long trench.

According to another embodiment of the present invention, a structure is provided. The structure may include: a long trench extending through a dielectric layer to a top surface of a substrate, the long trench length is larger than the long trench width, the long trench has a front region and a back region separated by a middle region, and the middle region extends across the width of the long trench; a bottom portion of a first semiconductor in the long trench and on the substrate; an insulator layer on the bottom portion of the first semiconductor; a top portion of the first semiconductor in the long trench, the top portion is directly on the bottom portion of the first semiconductor, and the top portion is in the middle region; and a second semiconductor in the long trench, the second semiconductor is directly on the insulator layer, and the second semiconductor is in the middle region.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
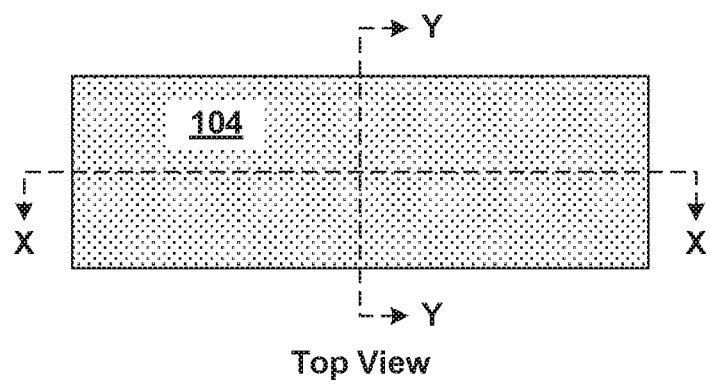
FIG. 1 is a front view, top view, and side view of a semiconductor structure, according to an exemplary embodiment.
Figure 1:
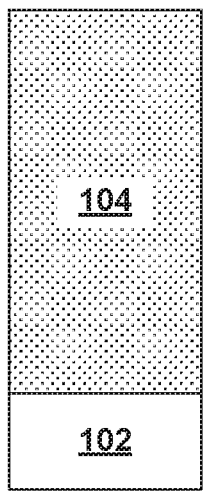
Figure 1:
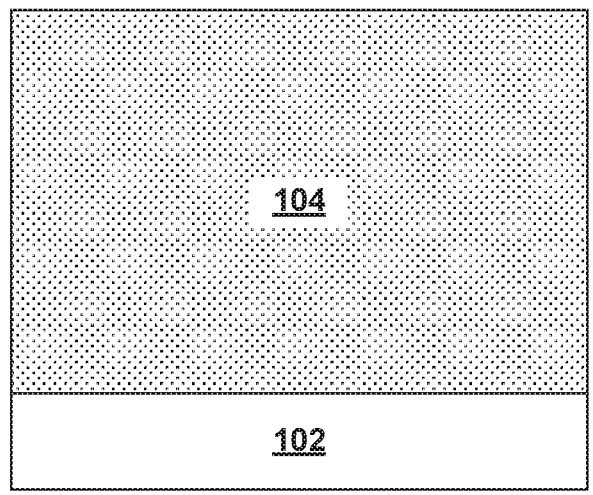

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the elimination of defects in long Aspect Ratio Trapping (ART) trench structures. Ideally, it may be desirable to form epitaxial layers using ART to trap defects in the bottom of trench structures, however, long trench structures used to form epitaxial layers can allow for defects to reach the surface along the trench length. One way to eliminate epitaxial layer defects in long trench structures includes using a mask-and-etch technique followed by the formation of a second epitaxial layer in a defect free region. One embodiment by with to form the described structure is described in detail below, referring to the accompanying drawings FIGS. 1-14.

With reference to FIG. 1, a demonstrative illustration of a structure 100 is provided during an intermediate step of fabricating a defect free epitaxial layer in a long trench structure, according to an embodiment. More specifically, the method can start with a first dielectric 104 on a substrate 102. FIG. 1 includes a top view, a side view, and a front view of structure 100. The front view is taken along cross-section line X-X and the side view is taken along cross-section line Y-Y.

The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. In an embodiment, the substrate 102 is a bulk silicon substrate.

The first dielectric 104 may be formed on the substrate 102 using any deposition technique known in the art, such as, for example, epitaxial growth, chemical vapor deposition (CVD), physical vapor deposition (PVD), or atomic layer deposition (ALD). The first dielectric 104 may be any dielectric material known in the art, such as, for example, silicon oxide or silicon nitride.

Figure 2:
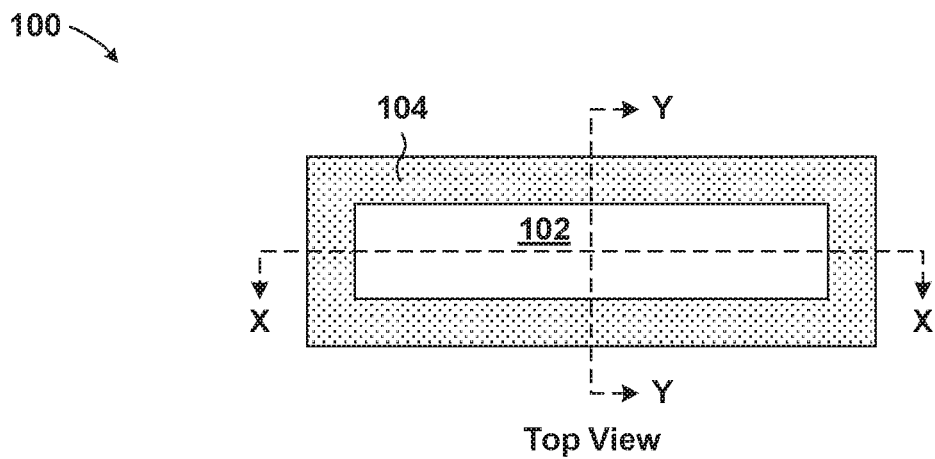
FIG. 2 is a front view, top view, and side view of the semiconductor structure and illustrates the formation of a long trench, according to an exemplary embodiment.
Figure 2:
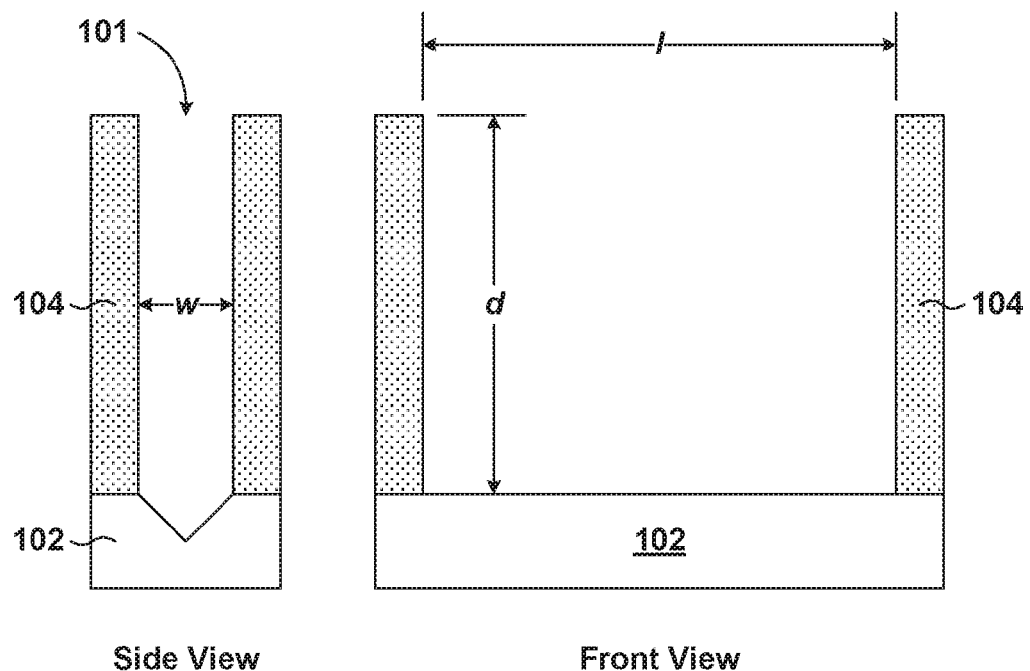

With reference to FIG. 2, a demonstrative illustration of the structure 100 is provided during an intermediate step of fabricating a defect free epitaxial layer in a long trench structure, according to an embodiment. More specifically, the method may include the formation of a long trench 101 through the first dielectric 104.

The long trench 101 may be formed by etching the first dielectric 104 using any etching technique known in the art such as, for example, a mask and etch processes including a patterned photoresist layer followed by a reactive ion etch (RIE). The long trench 101 may be formed using aspect ratio trapping (ART) for subsequently grown semiconductors. A good range for ART should be larger than 1:2, preferably between 1:5 to 1:20, however other ratio's may be used. The ART process may utilize deep trenches to epitaxially grow semiconductor materials where the semiconductor has a different lattice structure than the seed layer (discussed further with reference to FIG. 3). The long trench 101 may have a trench length (l), which is substantially larger than a trench width (w). The trench length (l) can range from about 100 nm to about 3000 nm, but other lengths may be used. The trench width (w) can range from about 8 nm to about 100 nm, but other widths may be used. The long trench 101 may also have a trench depth (d), which can range from about 50 nm to about 500 nm, but other depths may be used.

The long trench 101 may expose a top surface of the substrate 102. In the illustrated embodiment, the exposed top surface of the substrate 102 has a V-shape surface exposing 11111 planes of the substrate 102. The V-shape can help suppress formation of anti-phase boundaries during subsequent semiconductor material growth in the long trench 101.

Figure 3:
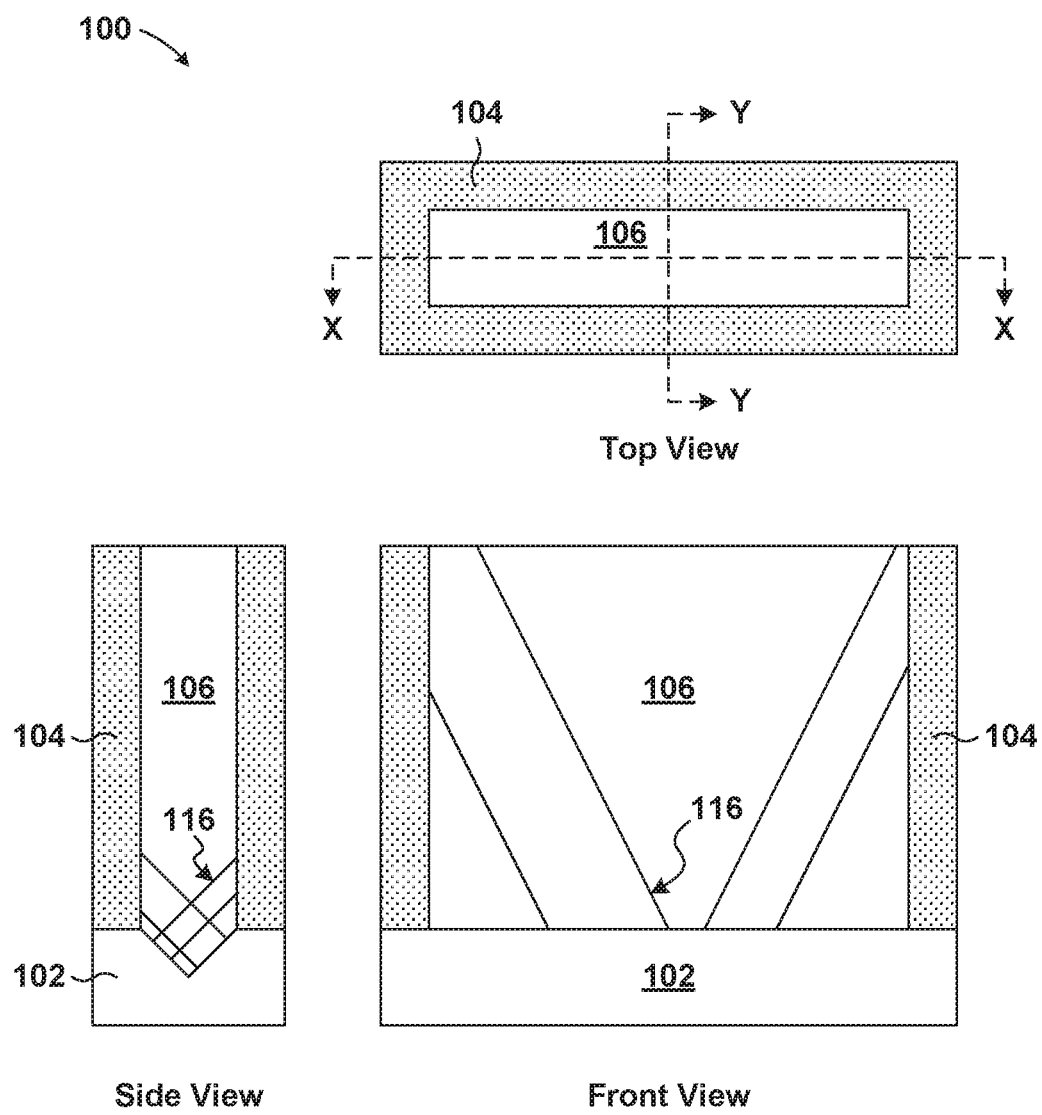
FIG. 3 is a front view, top view, and side view of the semiconductor structure and illustrates the formation of a first semiconductor in the long trench, according to an exemplary embodiment.

With reference to FIG. 3, a demonstrative illustration of the structure 100 is provided during an intermediate step of fabricating a defect free epitaxial layer in a long trench structure, according to an embodiment. More specifically, the method may include the formation of a first semiconductor 106 in the long trench 101.

The first semiconductor 106 may be formed in the long trench 101 using any growth technique known in the art such as, for example, an epitaxial deposition system including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In a CVD process, selective epitaxial growth may typically include introducing a source gas into a chamber. The source gas may include at least one precursor gas and a carrier gas such as, for example, hydrogen. A reactor chamber may be heated using RF-heating. A growth temperature in the chamber may range from about 300° C. to about 900° C., depending on the composition of the crystalline material. The growth system may also utilize low-energy plasma to enhance the layer growth kinetics. The first semiconductor 106 may be any semiconductor material known in the art, such as, for example, Si, Ge, SiGe, SiC, SiGeC, Ga, GaAs, InAs, InP, or any other III/V, II/VI or IV compound semiconductors. In an embodiment, the first semiconductor 106 is germanium epitaxially grown directly on the substrate 102, where the substrate 102 is a bulk silicon substrate. The first semiconductor 106 may be polished to a top surface of the first dielectric 104 using any polishing technique known in the art such as, for example, chemical-mechanical polishing (CMP).

Defects (i.e., misfit dislocations) are generally formed in an epitaxy layer when there is a lattice mismatch between the seed layer and the epitaxy layer. The defects can extend through the epitaxy layer, starting at the seed layer interface and extending to trench sidewalls or the surface of the epitaxy layer. When using ART growth, the trench used to form the epitaxy layer is typically deep enough to trap the defects in a bottom portion of the epitaxy layer, such that the defects terminate at trench sidewalls and the top portion of the epitaxy layer substantially defect free. However, when using the ART process for a long trench structure, the defects may reach the surface of the epitaxy layer.

In an embodiment, the substrate 102 is silicon (seed layer) having a different lattice structure than the first semiconductor 106, which is germanium (epitaxy layer). First defects 116 may form from the substrate 102 and extend upward. The first defects 116 may terminate along the sidewalls of the long trench 101 along the narrower width, however, the first defects 116 running along the length of the long trench 101 may reach the top surface of the first semiconductor layer 106. The following steps illustrate (with reference to FIGS. 3-14) a method of removing any defects along the length of the long trench 101.

Figure 4:
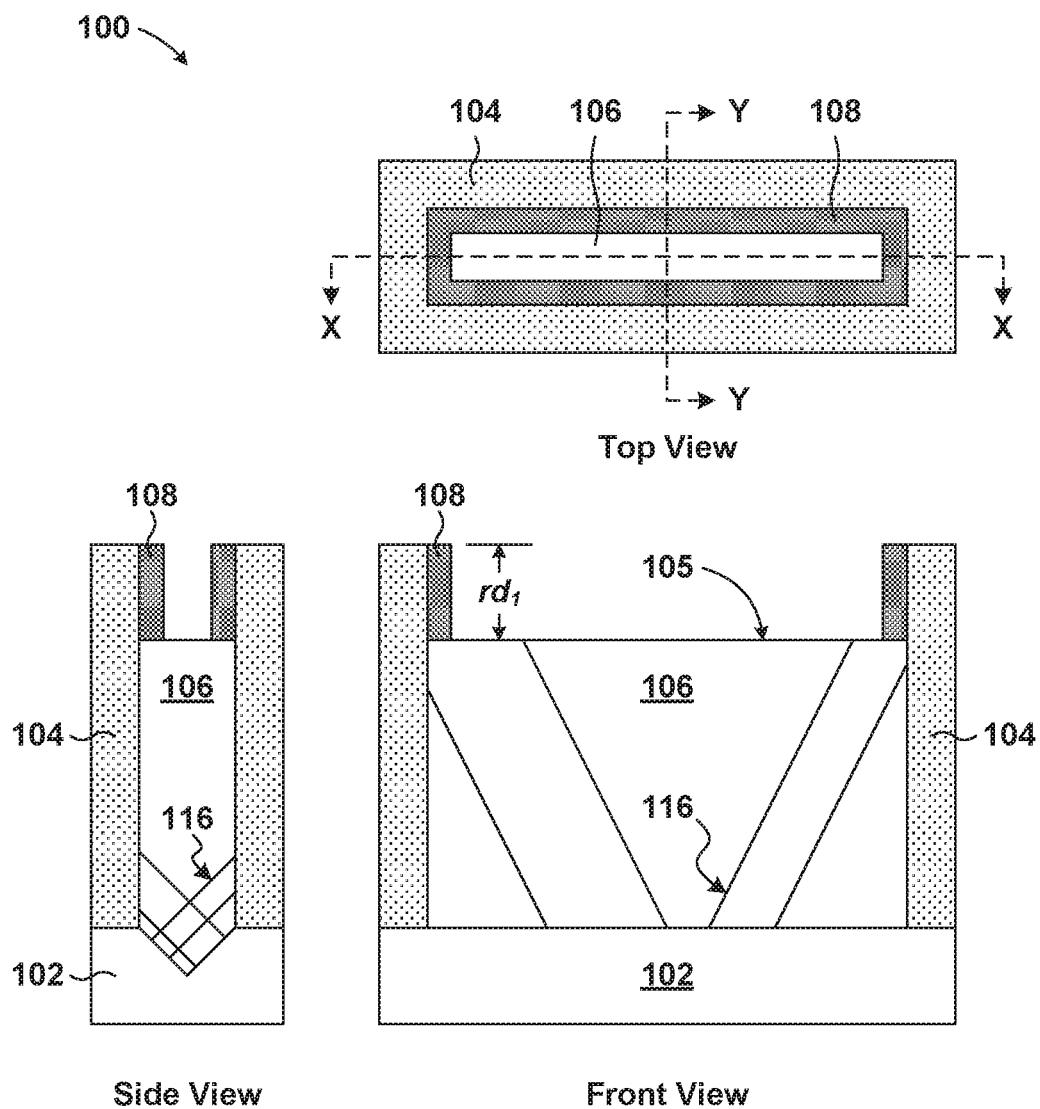
FIG. 4 is a front view, top view, and side view of the semiconductor structure and illustrates the formation of a first spacer on the first semiconductor, according to an exemplary embodiment.

With reference to FIG. 4, a demonstrative illustration of the structure 100 is provided during an intermediate step of fabricating a defect free epitaxial layer in a long trench structure, according to an embodiment. More specifically, the method may include recessing the first semiconductor 106 and forming a first spacer 108.

The first semiconductor 106 may be recessed using any etching technique known in the art such as, for example, an RIE. The first semiconductor 106 may be recessed to a first recessed depth ($rd_1$), which can be relative to the trench depth (d), for example, around 10% of the trench depth (d), but other depths may be used.

The first spacer 108 may be formed on the sidewalls of the long trench 101 above a first recessed surface 105 of the first semiconductor 106. The first spacer 108 may be conformally formed using any spacer formation technique known in the art such as, for example, chemical vapor deposition, plasma enhanced chemical vapor deposition, or atomic layer deposition. The first spacer 108 may have a thickness ranging from about 2 nm to about 15 nm. The first spacer 108 may be any spacer material known in the art, such as, for example, an oxide or a nitride. The recessed surface of the first semiconductor 106 is still exposed in a central area, as is seen in the figure.

Figure 5:
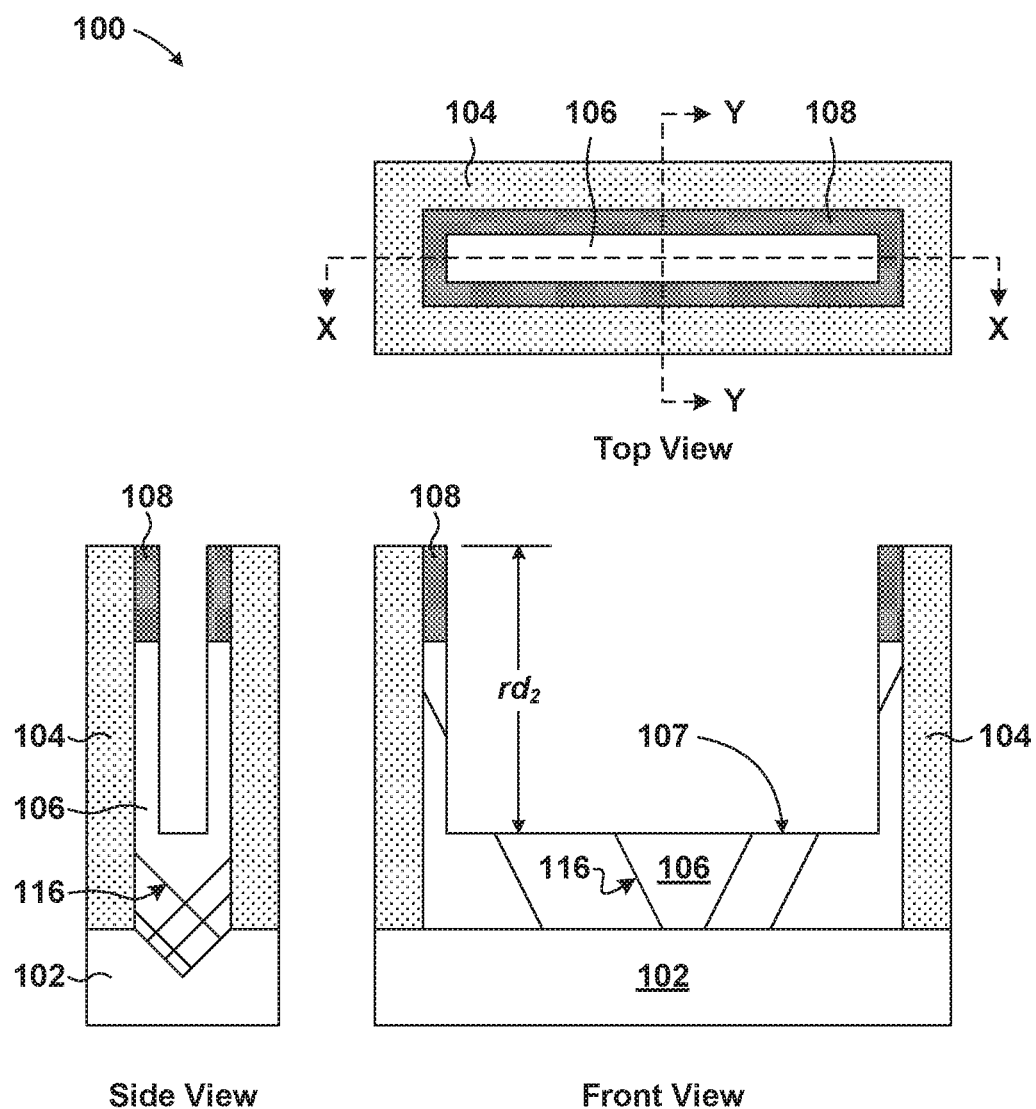
FIG. 5 is a front view, top view, and side view of the semiconductor structure and illustrates the removal of an exposed portion of the first semiconductor, according to an exemplary embodiment.

With reference to FIG. 5, a demonstrative illustration of the structure 100 is provided during an intermediate step of fabricating a defect free epitaxial layer in a long trench structure, according to an embodiment. More specifically, the method may include recessing the first semiconductor 106 to a second recessed depth ($rd_2$).

The first semiconductor 106 may be recessed using any etching technique known in the art such as, for example, an RIE. The first spacer 108 may be used as a mask during the recessing step, such that a portion of the first semiconductor 106 remains along the sidewall of the long trench 101 between a bottom surface of the first spacer 108 and a second recessed surface 107. The first semiconductor 106 may be recessed to a second recessed depth ($rd_2$), which can be relative to the trench depth (d), for example, ranging from about 50% to about 60% of the trench depth (d), but other depths may be used.

Figure 6:
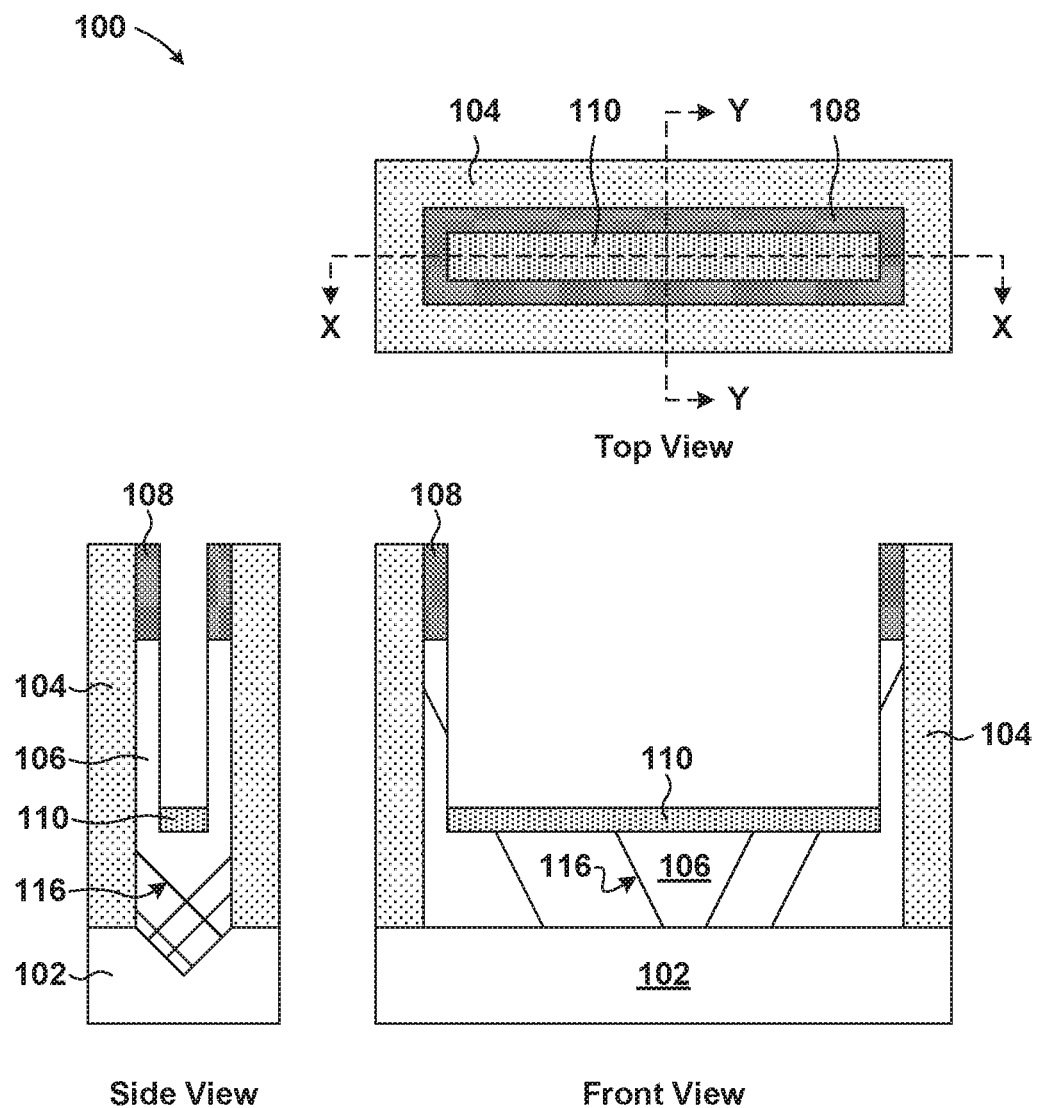
FIG. 6 is a front view, top view, and side view of the semiconductor structure and illustrates the formation of an insulator layer on the recessed portion of the first semiconductor, according to an exemplary embodiment.

With reference to FIG. 6, a demonstrative illustration of the structure 100 is provided during an intermediate step of fabricating a defect free epitaxial layer in a long trench structure, according to an embodiment. More specifically, the method may include forming an insulator layer 110 on the second recessed surface 107.

The insulator layer 110 may be formed on the first semiconductor 106 using any deposition technique known in the art such as, for example, directional HDP oxide deposition, epitaxial growth, chemical vapor deposition (CVD), physical vapor deposition (PVD), or atomic layer deposition (ALD). The insulator layer 110 may be any dielectric material known in the art, such as, for example, an oxide or nitride.

Figure 7:
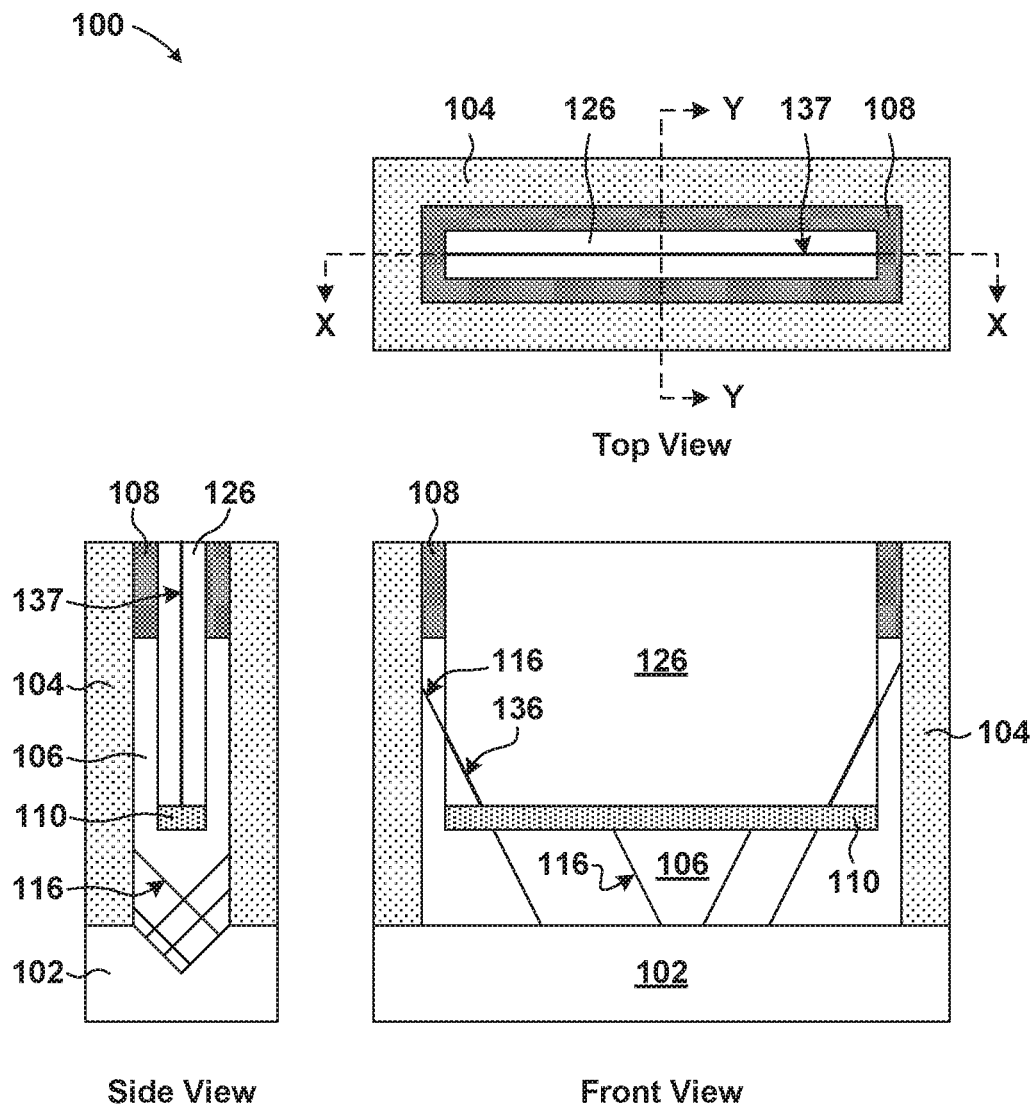
FIG. 7 is a front view, top view, and side view of the semiconductor structure and illustrates the formation of a second semiconductor on the insulator layer, according to an exemplary embodiment.

With reference to FIG. 7, a demonstrative illustration of the structure 100 is provided during an intermediate step of fabricating a defect free epitaxial layer in a long trench structure, according to an embodiment. More specifically, the method may include forming a second semiconductor 126 in a recessed trench, where the first spacer 108 and the first semiconductor 106 form the recessed trench sidewalls, and the insulator layer 110 is the bottom of the recessed trench.

The second semiconductor 126 may be formed in the recessed trench using any deposition technique known in the art such as, for example, epitaxial growth, chemical vapor deposition (CVD), physical vapor deposition (PVD), or atomic layer deposition (ALD). The second semiconductor 126 may only need to be grown until the opening of the recessed trench is pinched off (i.e., half the width of the recessed trench). The second semiconductor 126 may be any semiconductor material known in the art, such as, for example, Si, Ge, SiGe, SiC, SiGeC, Ga, GaAs, InAs, InP, or any other III/V, II/VI or IV compound semiconductors. In an embodiment, the second semiconductor 126 can be the same as the first semiconductor 106 (e.g., germanium), or may be a different material (e.g., a III-V semiconductor).

Second defects 136 may be formed from the first defects 116 along the recessed trench sidewalls. However, the first defects 116 which originally reached the top surface of the first semiconductor 106 (with reference to FIG. 3) are no longer present because of the isolation of those defects by the insulator layer 110. Additionally, a defective interface 137 may form where the second semiconductor 126 surfaces meet (i.e., at the halfway point between the recessed trench sidewalls. The following steps illustrate (with reference to FIGS. 8-14) a method of removing the second defects 136 in the second semiconductor 126.

Figure 8:
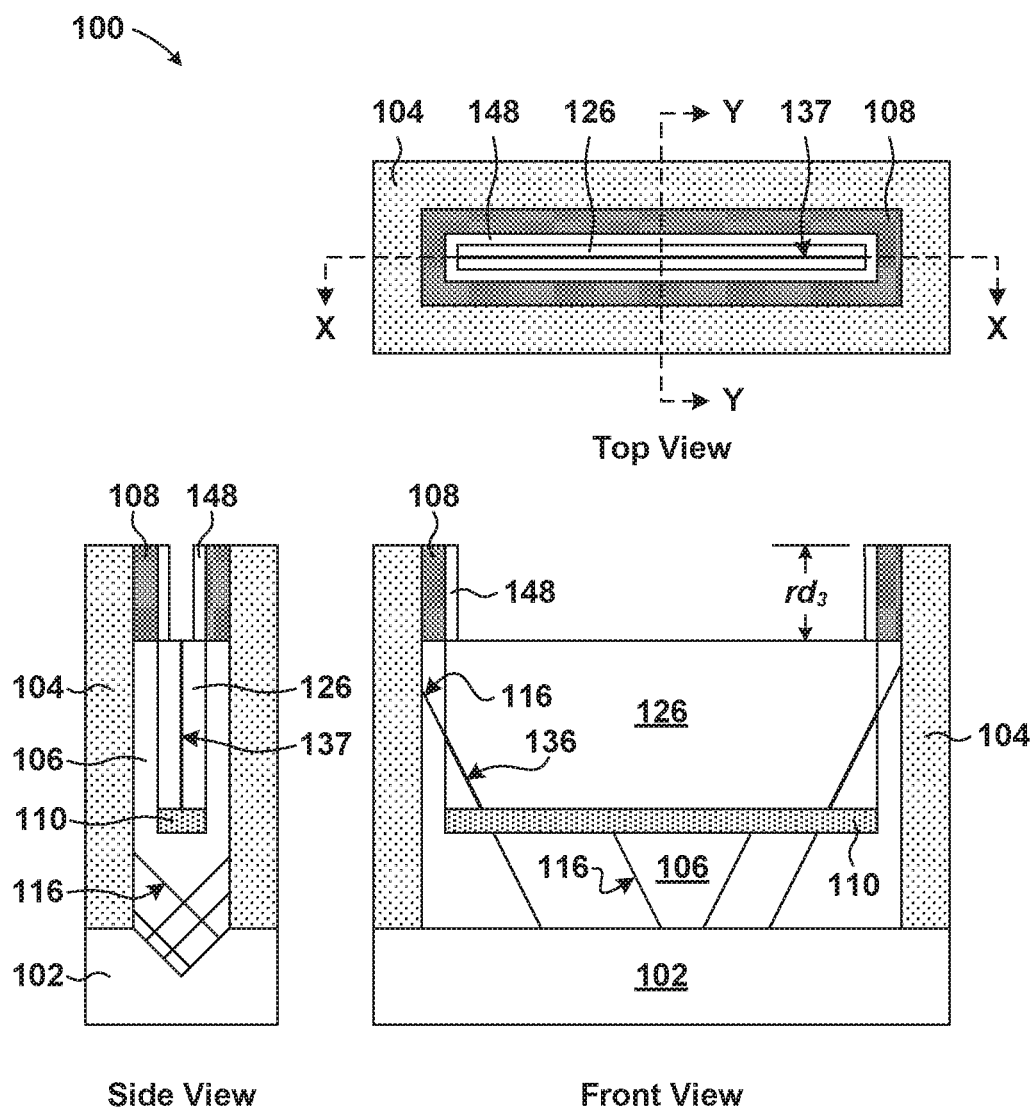
FIG. 8 is a front view, top view, and side view of the semiconductor structure and illustrates the formation of a second spacer on a recessed portion of the second semiconductor, according to an exemplary embodiment.

With reference to FIG. 8, a demonstrative illustration of the structure 100 is provided during an intermediate step of fabricating a defect free epitaxial layer in a long trench structure, according to an embodiment. More specifically, the method may include recessing the second semiconductor 126 and forming a second spacer 148.

The second semiconductor 126 may be recessed using any etching technique known in the art such as, for example, an RIE. The first spacer 108 may be used as a mask during the recessing step. The second semiconductor 126 may be recessed to a third recessed depth (rd$_3$), which may be equal to the first recessed depth (rd$_1$), but other depths may be used. The second semiconductor 126 may be recessed, such that a top surface of the recessed second semiconductor 126 is substantially coplanar with the bottom surface of the first spacer 108.

The second spacer 148 may be formed on the sidewalls of the first spacer 108 and above the top surface of the second semiconductor 126. The second spacer 148 may be conformally formed using any spacer formation technique known in the art such as, for example, chemical vapor deposition, plasma enhanced chemical vapor deposition, or atomic layer deposition. The second spacer 148 may have a thickness ranging from about 2 nm to about 15 nm. The second spacer 148 may be any spacer material known in the art, such as, for example, an oxide or a nitride.

Figure 9:
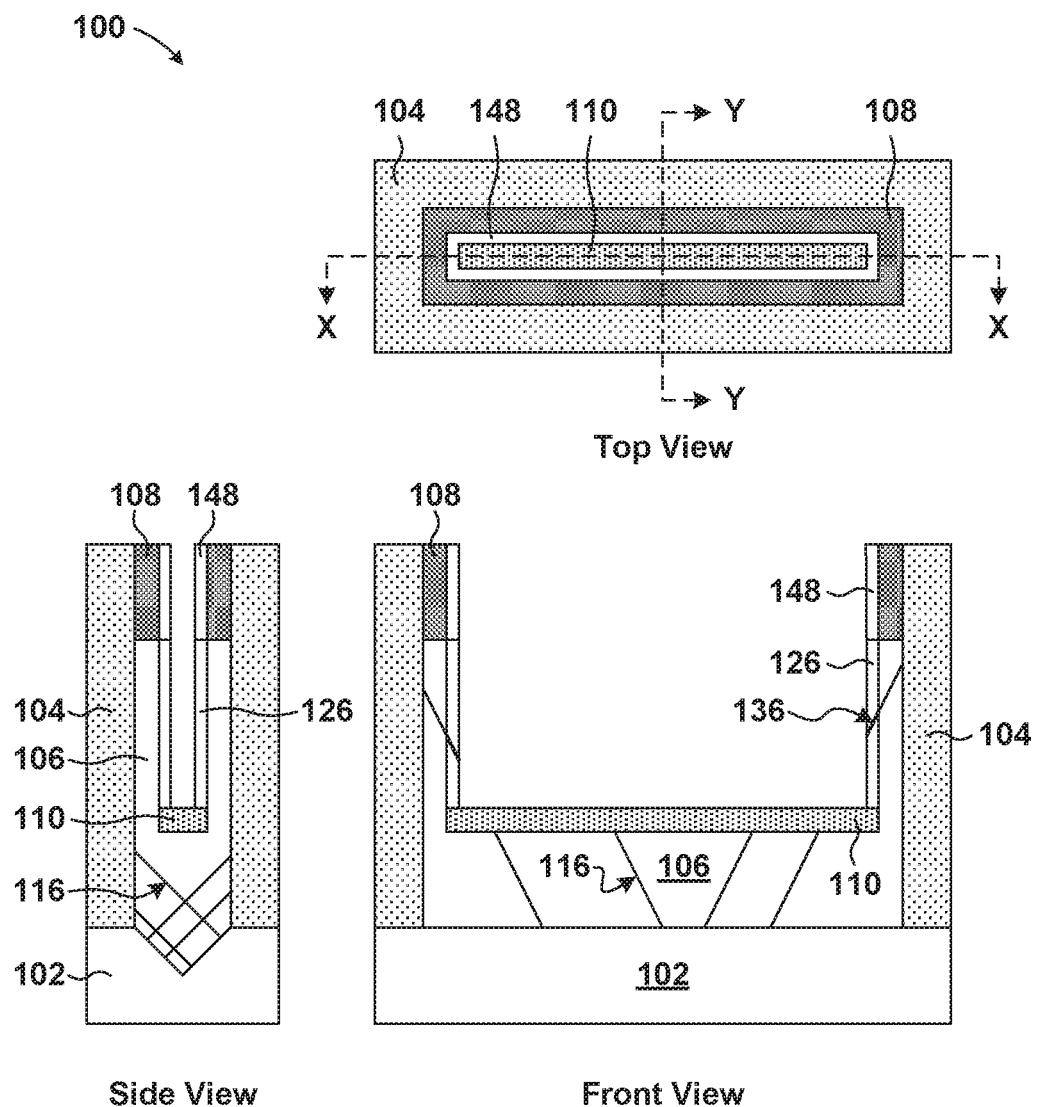
FIG. 9 is a front view, top view, and side view of the semiconductor structure and illustrates the removal of an exposed portion of the second semiconductor, according to an exemplary embodiment.

With reference to FIG. 9, a demonstrative illustration of the structure 100 is provided during an intermediate step of fabricating a defect free epitaxial layer in a long trench structure, according to an embodiment. More specifically, the method may include etching exposed portions of the second semiconductor 126.

Exposed portions of the second semiconductor 126 may be removed using any etching technique known in the art such as, for example, a selective anisotropic etching technique using the first spacer 108 and the second spacer 148 as a mask, and using the insulator layer 110 as an etch stop. The portion of the second semiconductor 126 that is underneath the second spacer 148 can remain along the sidewalls of the first semiconductor 106.

Figure 10:
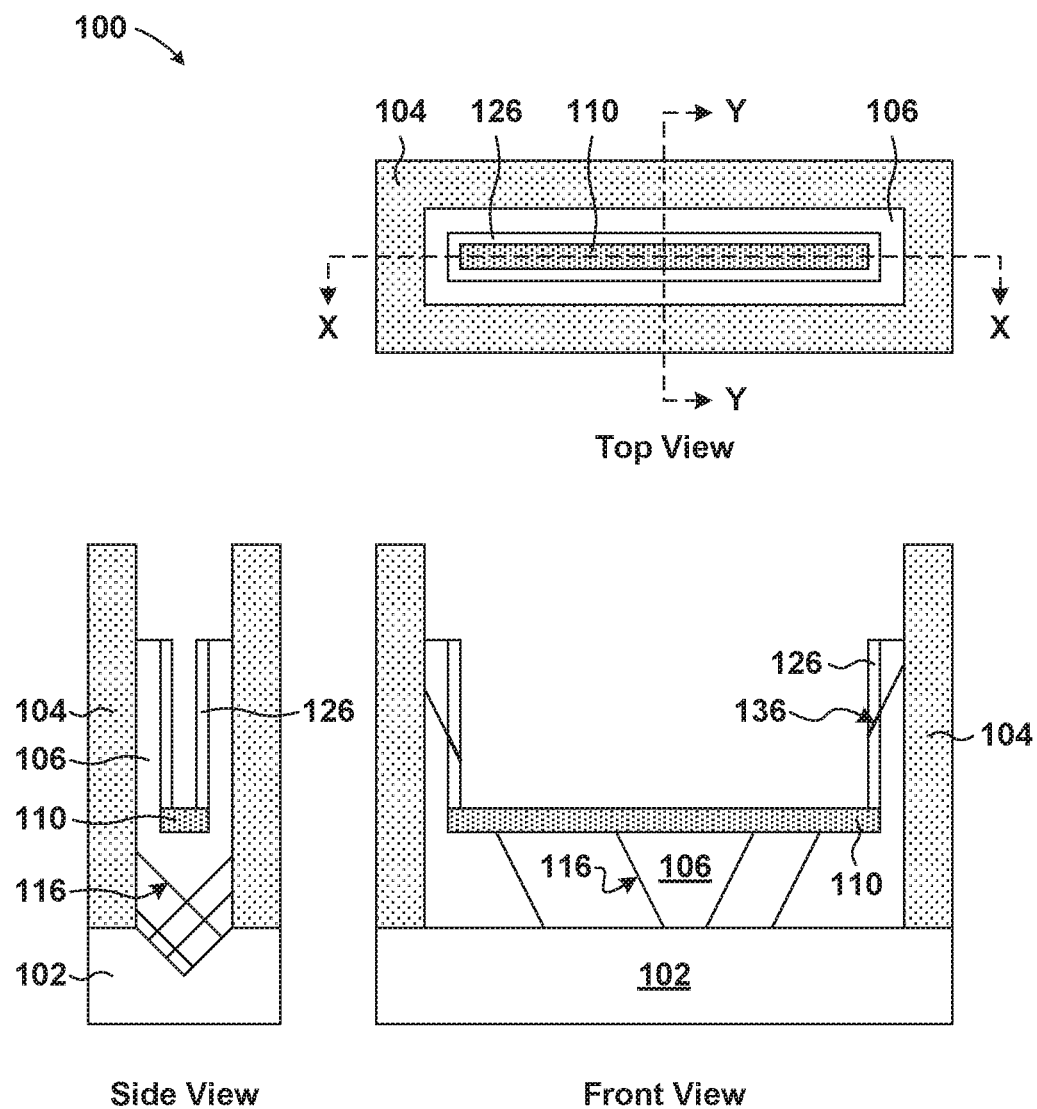
FIG. 10 is a front view, top view, and side view of the semiconductor structure and illustrates the removal of the first and second spacers, according to an exemplary embodiment.

With reference to FIG. 10, a demonstrative illustration of the structure 100 is provided during an intermediate step of fabricating a defect free epitaxial layer in a long trench structure, according to an embodiment. More specifically, the method may include removing the first spacer 108 and the second spacer 148. The first spacer 108 and the second spacer 148 may be removed using any etching technique know in the art such as, for example, a selective etch using the first semiconductor 106 and the second semiconductor 126 as an etch stop.

Figure 11:
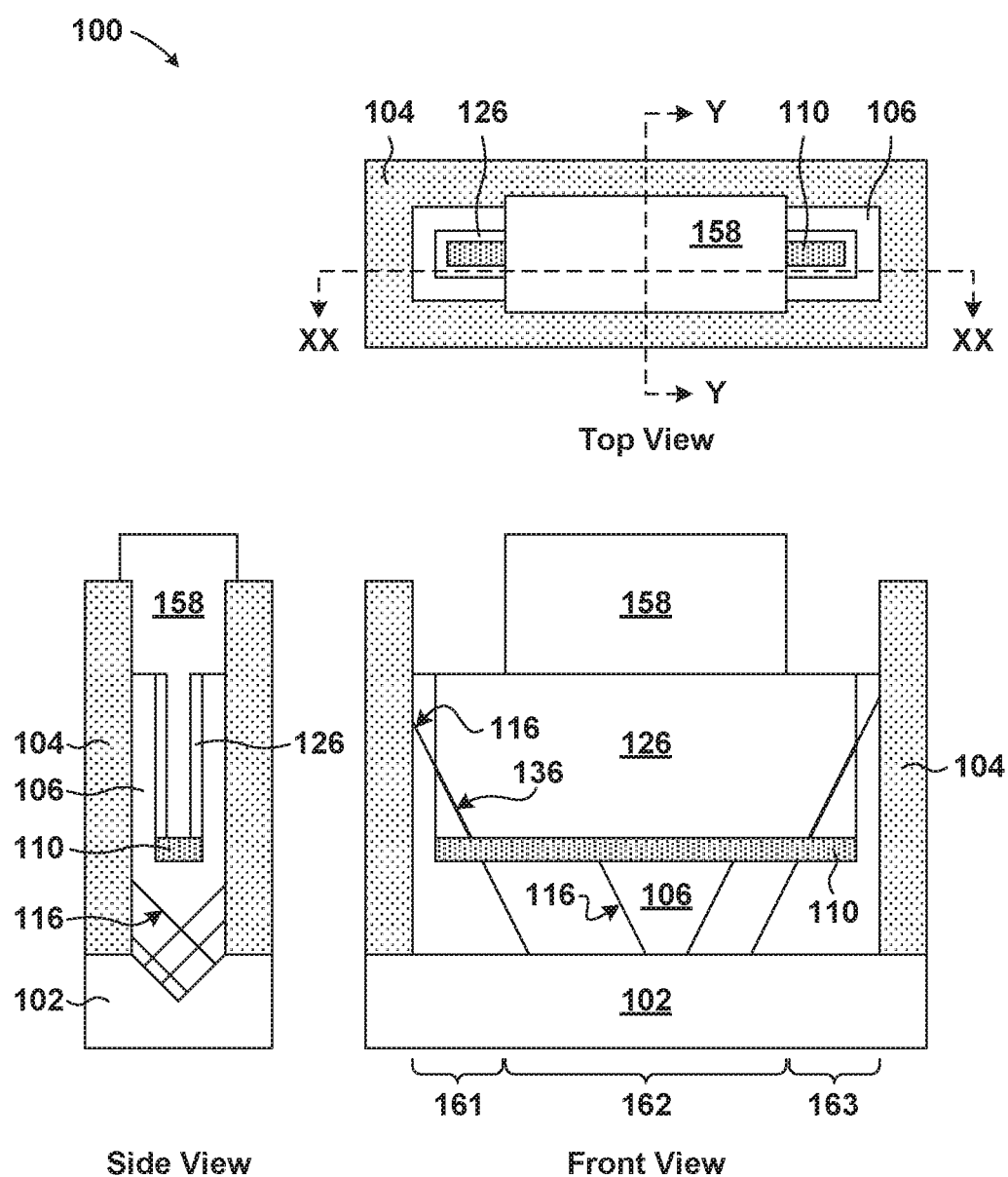
FIG. 11 is a front view, top view, and side view of the semiconductor structure and illustrates the formation of a mask in a middle region of the long trench, according to an exemplary embodiment.

With reference to FIG. 11, a demonstrative illustration of the structure 100 is provided during an intermediate step of fabricating a defect free epitaxial layer in a long trench structure, according to an embodiment. More specifically, the method may include forming a block mask 158 above the first semiconductor 106 and the second semiconductor 126. It should be noted, the front view is now taken along cross-section line XX-XX.

The block mask 158 may be formed on the structure 100 using any mask forming technique known in the art such as, for example, atomic layer deposition (ALD), molecular layer deposition (MLD), chemical vapor deposition (CVD), physical vapor deposition (PVD), and spin on techniques. The block mask 158 can be formed over a front region 161, a middle region 162 (also referred to as a central region), and a back region 163. The middle region 162 can be the region where the first and second semiconductors 106, 126 are defect free. The block mask 158 may be removed from above the front region 161 and the back region 163 using any patterning technique know in the art such as, for example, a mask and etch technique. The block mask 158 may be any masking material known in the art, such as, for example, an oxide or nitride.

Figure 12:
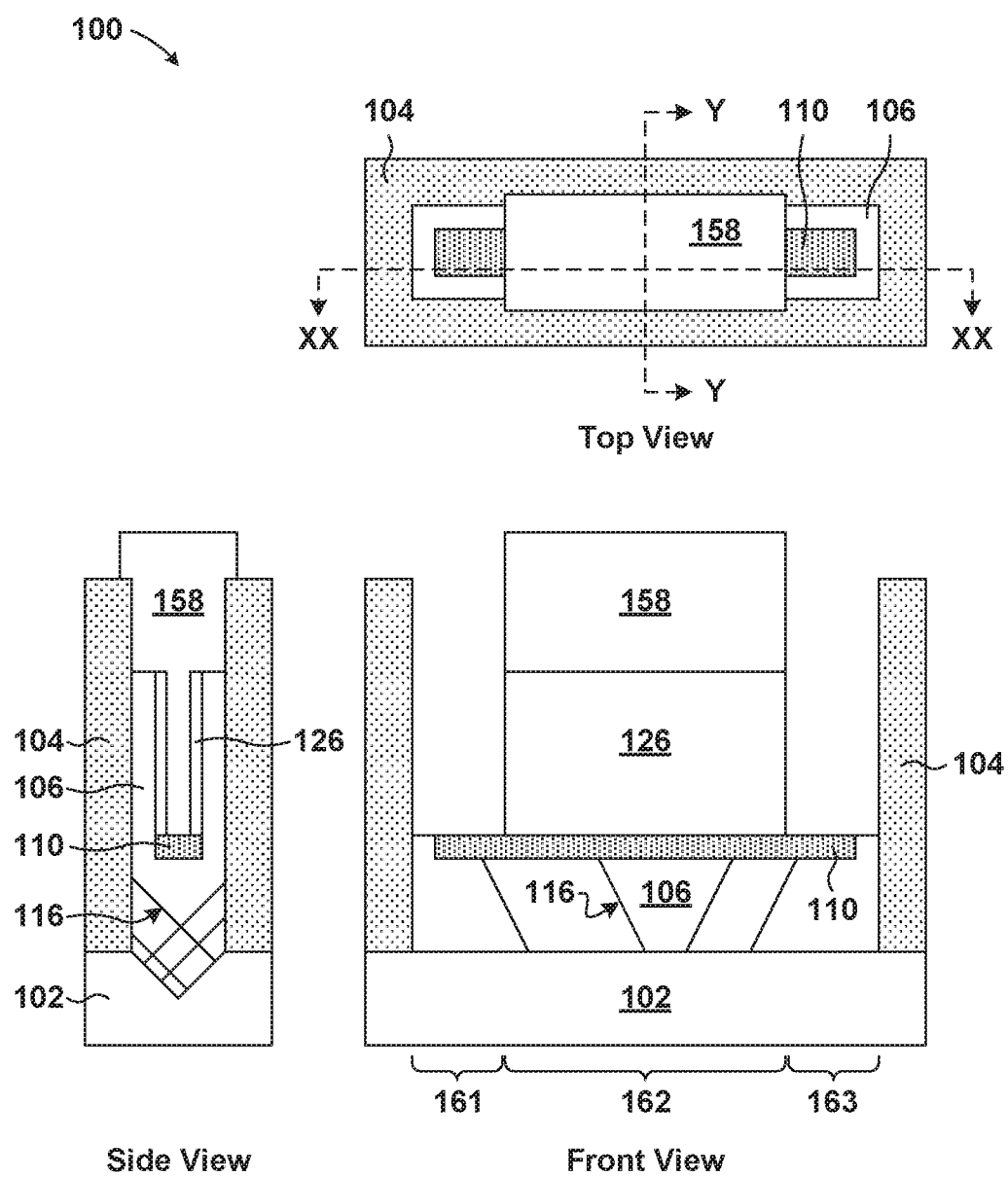
FIG. 12 is a front view, top view, and side view of the semiconductor structure and illustrates the removal of a front and back portion of the first and second semiconductor, according to an exemplary embodiment.

With reference to FIG. 12, a demonstrative illustration of the structure 100 is provided during an intermediate step of fabricating a defect free epitaxial layer in a long trench structure, according to an embodiment. More specifically, the method may include removing exposed portion of the first semiconductor 106 and the second semiconductor 126 from the front region 161 and the back region 163. The first semiconductor 106 and the second semiconductor 126 may be removed using any etching technique known in the art such as, for example, a RIE using the block mask 158 as a mask and the insulator layer 110 as an etch stop.

Figure 13:
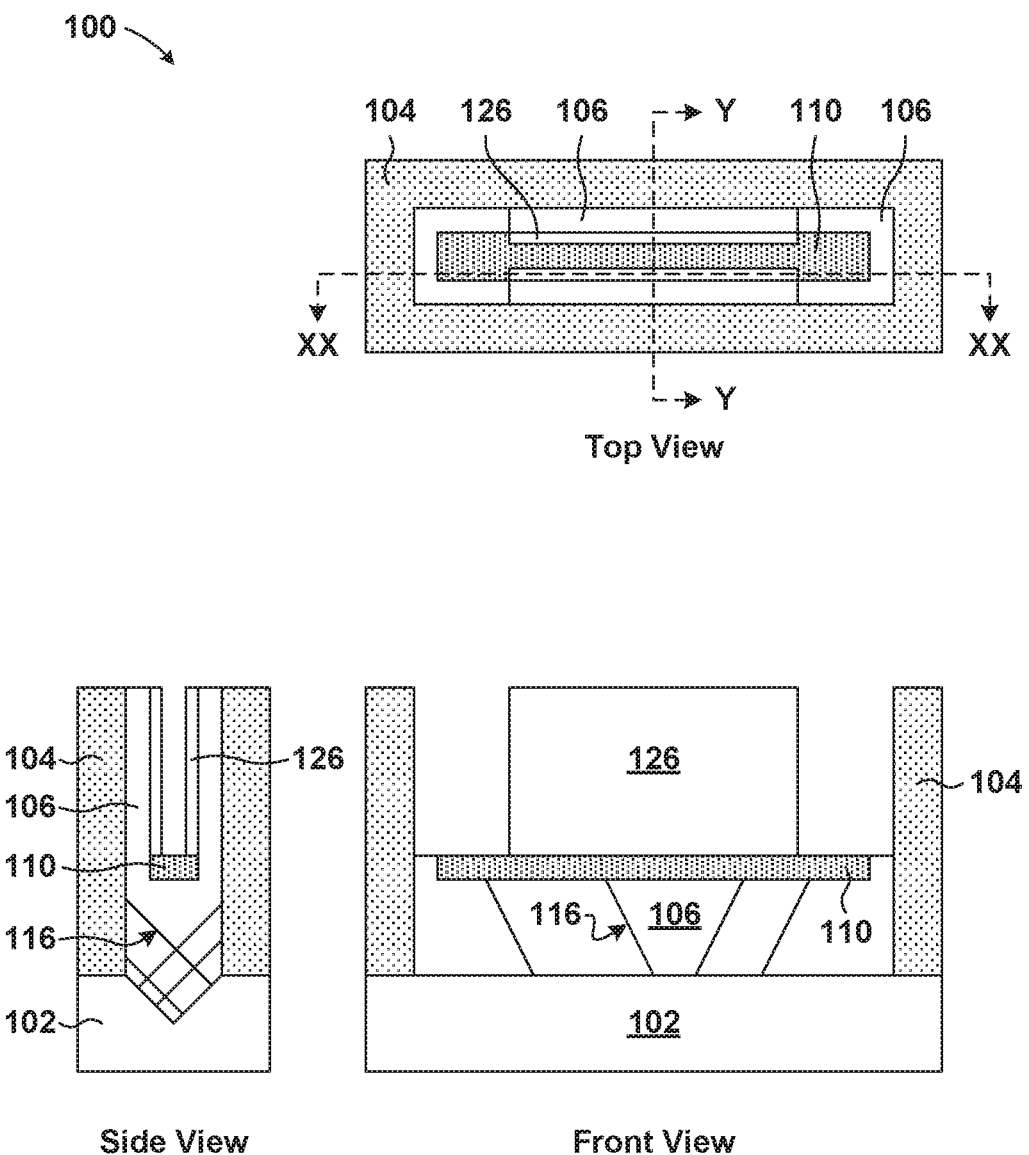
FIG. 13 is a front view, top view, and side view of the semiconductor structure and illustrates the removal of the mask, according to an exemplary embodiment.
Figure 14:
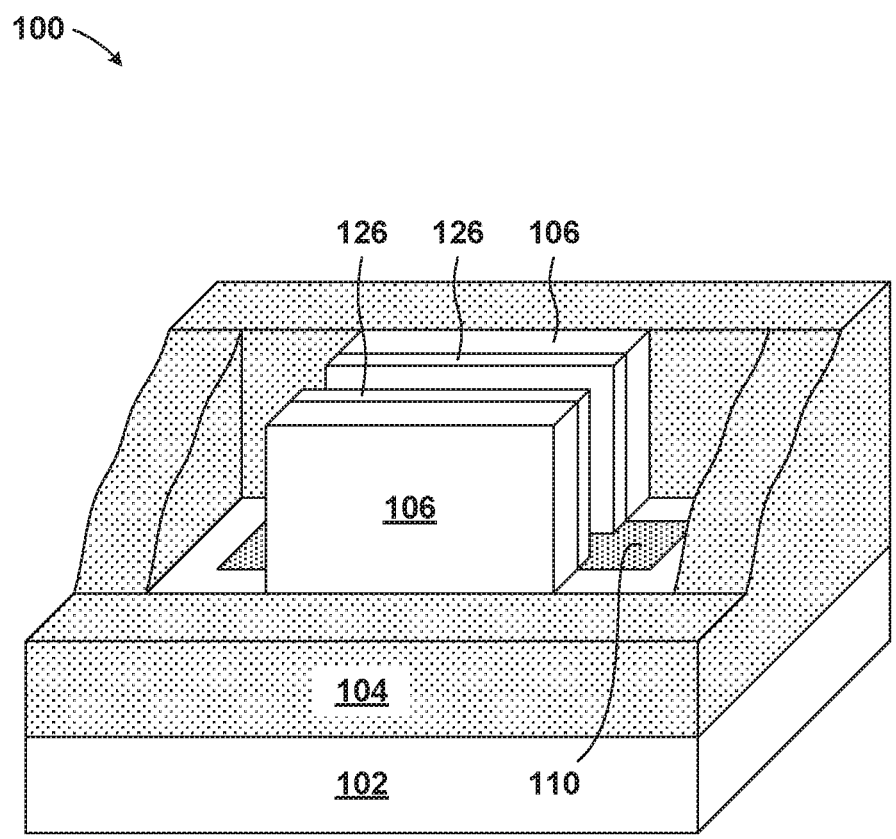
FIG. 14 is an isometric view of the semiconductor structure, according to an exemplary embodiment.

With reference to FIGS. 13 and 14, a demonstrative illustration of the structure 100 is provided during an intermediate step of fabricating a defect free epitaxial layer in a long trench structure, according to an embodiment. More specifically, the method may include removing the block mask 158 and polishing the first dielectric 104. It should be noted, FIG. 14 is an isometric view of the structure 100 with a front portion of the first dielectric 104 cut away for illustrative purposes.

The block mask 158 may be completely removed using any removal technique know in the art such as, for example, a selective etching process. The first dielectric 104 may be polished using any polishing technique known in the art such as, for example, CMP. A top surface of the first dielectric 104 may be coplanar with the top surface of the first semiconductor 106 and the second semiconductor 126.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A method of removing defects in a semiconductor formed in a long aspect ratio trapping (ART) trench, the method comprising:
   providing a dielectric layer on a substrate;
   forming a long trench in the dielectric layer exposing the substrate, wherein a length of the long trench is longer than a width of the long trench;
   forming a first semiconductor in the long trench;

forming a first spacer on sidewalls of the long trench above the first semiconductor, wherein a portion of the top surface of the first semiconductor includes an exposed portion;

recessing the exposed portion of the top surface of the first semiconductor;

forming an insulator layer on the recessed top surface of the first semiconductor, wherein a sidewall portion of the first semiconductor is exposed above the insulator layer, and the sidewall portion of the first semiconductor is directly below the first spacer;

forming a second semiconductor in the long trench along exposed sidewall portions of the first semiconductor, the second semiconductor is directly above the insulator layer, and the top surface of the second semiconductor is below the top surface of the first spacer;

forming a second spacer in the long trench on sidewalls of the first spacer, the second spacer is directly above a sidewall portion of the second semiconductor, wherein the top surface of the second semiconductor includes a second exposed portion;

removing the exposed portion of the second semiconductor, wherein the sidewall portion of the second semiconductor is exposed between the insulator layer and the second spacer; and removing a front end and a back end of the first semiconductor and the second semiconductor from above the insulator layer, wherein the front end and back end are separated by a central region which extends across the width of the long trench.

2. The method of claim 1, wherein forming the first semiconductor in the long trench further comprises:

forming the first semiconductor in the long trench, wherein the top surface of the first semiconductor is coplanar or above the top surface of the dielectric layer; and recessing the top surface of the first semiconductor, wherein the recessed top surface of the first semiconductor is below the top surface of the dielectric layer.

3. The method of claim 1, wherein the steps of forming the second semiconductor in the long trench along the exposed sidewall portions of the first semiconductor further comprises:

forming the second semiconductor in the long trench along the exposed sidewall portions of the first semiconductor, wherein the top surface of the second semiconductor is coplanar or above the top surface of the first spacer; and recessing the top surface of the second semiconductor.

4. The method of claim 1, further comprising:

removing the first spacer and second spacer from above the first semiconductor and from above the second semiconductor.

5. The method of claim 1, wherein the step of removing a frond end and a back end of the first semiconductor and second semiconductor from above the insulator layer further comprising:

forming a mask over the central region; and removing the mask after removing the front end and the back end of the first semiconductor and second semiconductor from above the insulator layer.

6. The method of claim 1, wherein the substrate is silicon, the dielectric layer is an oxide, the first semiconductor is germanium, the first spacer is a nitride, and the insulator layer is an oxide.

7. The method of claim 3, wherein the recessed top surface of the second semiconductor is coplanar with the top surface of the sidewall portion of the first semiconductor.

8. A method of removing defects in a semiconductor formed in a long trench comprising:

forming a first semiconductor on a substrate, the first semiconductor is in a long trench, the long trench extends through a dielectric layer, and the long trench width is less than the long trench length;

forming a first spacer in the long trench and along sidewalls of the dielectric layer, the first spacer has a thickness equal to less than half of the long trench width, wherein a portion of the first semiconductor is exposed;

recessing the exposed portion of the first semiconductor;

forming an insulator layer on the recessed portion of the first semiconductor;

forming a second semiconductor on the insulator layer, wherein the top surface of the second semiconductor is below the top surface of the first spacer;

forming a second spacer in the long trench and along sidewalls of the first spacer, wherein a portion of the second semiconductor is exposed;

removing the exposed portion of the second semiconductor, wherein a sidewall portion of the second semiconductor is between the second spacer and the insulator layer; and removing a frond end and a back end of the first semiconductor and the second semiconductor, wherein the front end and back end are separated by a central region.

9. The method of claim 8, wherein the steps of forming the first semiconductor in the long trench further comprises:

forming the first semiconductor in the long trench, wherein the top surface of the first semiconductor is coplanar or above the top surface of the dielectric layer; and recessing the top surface of the first semiconductor, wherein the recessed top surface of the first semiconductor is below the top surface of the dielectric layer.

10. The method of claim 8, wherein the steps of forming the second semiconductor on the insulator layer further comprises:

forming the second semiconductor in the long trench along exposed sidewall portions of the first semiconductor; and recessing the top surface of the second semiconductor.

11. The method of claim 8, further comprising:

removing the first spacer and second spacer from above the first semiconductor and from above the second semiconductor.

12. The method of claim 8, wherein the step of removing a frond end and a back end of the first semiconductor and second semiconductor from above the insulator layer further comprising:

forming a mask over the central region; and removing the mask after removing the front end and the back end of the first semiconductor and second semiconductor from above the insulator layer.

13. The method of claim 8, wherein the central region extends across the width of the long trench.

14. The method of claim 8, wherein the substrate is silicon, the dielectric layer is an oxide, the first semiconductor is germanium, the first spacer is a nitride, and the insulator layer is an oxide.

15. A structure comprising:
a long trench extending through a dielectric layer to a top surface of a substrate, the long trench length is larger than the long trench width, the long trench has a front region and a back region separated by a middle region, and the middle region extends across the width of the long trench;
a bottom portion of a first semiconductor in the long trench and on the substrate;
an insulator layer on the bottom portion of the first semiconductor;
a top portion of the first semiconductor in the long trench, the top portion is directly on the bottom portion of the first semiconductor, and the top portion is in the middle region; and
a second semiconductor in the long trench, the second semiconductor is directly on the insulator layer, the second semiconductor is in the middle region, wherein the second semiconductor includes two regions on opposite sides of the insulator layer, and the two regions of the second semiconductor are separated by a gap.

16. The structure of claim 15, wherein the top portion of the first semiconductor includes two regions on opposite sides of the insulator layer.

17. The structure of claim 15, wherein the top portion of the first semiconductor is directly next to the second semiconductor.

18. The structure of claim 15, wherein the insulator layer is not directly below the top portion of the first semiconductor.

19. The structure of claim 15, wherein the substrate is silicon, the dielectric layer is an oxide, the first semiconductor is germanium, and the insulator layer is an oxide.

* * * * *